(12) United States Patent
Rendek, Jr. et al.

(10) Patent No.: US 9,117,602 B2
(45) Date of Patent: Aug. 25, 2015

(54) THREE-DIMENSIONAL LIQUID CRYSTAL POLYMER MULTILAYER CIRCUIT BOARD INCLUDING MEMBRANE SWITCH AND RELATED METHODS

(75) Inventors: Louis Joseph Rendek, Jr., West Melbourne, FL (US); Lawrence Wayne Shacklette, Melbourne, FL (US); Paul Brian Jaynes, Indialantic, FL (US); Philip Anthony Marvin, Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 475 days.

(21) Appl. No.: 12/016,089

(22) Filed: Jan. 17, 2008

(65) Prior Publication Data

US 2009/0185357 A1    Jul. 23, 2009

(51) Int. Cl.
*H05K 1/03*    (2006.01)
*H05K 1/09*    (2006.01)
*H01H 13/704*    (2006.01)
(Continued)

(52) U.S. Cl.
CPC ........... *H01H 13/704* (2013.01); *H05K 1/0284* (2013.01); *H05K 3/4614* (2013.01); *H05K 3/4632* (2013.01); *H05K 2201/0141* (2013.01); *H05K 2201/091* (2013.01); *Y10T 29/4913* (2015.01)

(58) Field of Classification Search
CPC .............. H01H 13/704; H05K 1/0284; H05K 2201/0141; H05K 2201/091; H05K 3/4614; H05K 3/4632
USPC .............. 174/260, 256; 361/728, 762; 29/846
See application file for complete search history.

(56) References Cited

U.S. PATENT DOCUMENTS

| | | | |
|---|---|---|---|
| 4,526,835 A | 7/1985 | Takahashi et al. | |
| 4,923,736 A | 5/1990 | Hiza et al. | |
| 5,072,077 A * | 12/1991 | Klein | ............................ 200/5 A |

(Continued)

FOREIGN PATENT DOCUMENTS

| | | | |
|---|---|---|---|
| CA | 2273542 | 12/1999 | |
| EP | 1045413 | 10/2000 | ............. H01H 13/14 |

(Continued)

OTHER PUBLICATIONS

"Chip Assembly on MID (Molded Interconnect Device)—A Path to Chip Modules with Increased Functionality", Hunziker, Harting Mitronics AG, Harting tec.News 13-I2005, 2005, 6 pages, available at http://www.harting-mitronics.ch/imperia/md/content/lg/hartingmitronics/downloads/produktionundtechnologie/en/chipmontage_en.pdf.

(Continued)

*Primary Examiner* — Yuriy Semenenko
(74) *Attorney, Agent, or Firm* — Allen, Dyer, Doppelt, Milbrath & Gilchrist, P.A.

(57) ABSTRACT

An electronic device includes a multilayer circuit board having a non-planar three-dimensional shape defining a membrane switch recess therein. The multilayer circuit board may include at least one liquid crystal polymer (LCP) layer, and at least one electrically conductive pattern layer thereon defining at least one membrane switch electrode adjacent the membrane switch recess to define a membrane switch. The electronic may further include a compressible dielectric material filling the membrane switch recess. The electronic device may also include at least one spring member within the membrane switch recess.

9 Claims, 14 Drawing Sheets

(51) Int. Cl.
*H05K 1/02* (2006.01)
*H05K 3/46* (2006.01)

(56) References Cited

U.S. PATENT DOCUMENTS

| | | | |
|---|---|---|---|
| 5,261,154 A | 11/1993 | Ferrier et al. | |
| 5,391,622 A | 2/1995 | Ho et al. | 525/171 |
| 5,464,658 A | 11/1995 | Yuhas et al. | |
| 5,886,134 A | 3/1999 | Wang et al. | |
| 5,979,043 A | 11/1999 | Baker et al. | |
| 6,032,357 A * | 3/2000 | Wojewnik | 29/846 |
| 6,149,853 A | 11/2000 | Luckett et al. | |
| 6,268,026 B1 | 7/2001 | Jester et al. | 428/1.6 |
| 6,334,922 B1 | 1/2002 | Tanaka et al. | 156/234 |
| 6,371,361 B1 | 4/2002 | Yamaguchi et al. | 228/200 |
| 6,521,373 B1 | 2/2003 | Suzuki | 429/162 |
| 6,521,830 B1 * | 2/2003 | Platz | 174/50 |
| 6,560,844 B1 | 5/2003 | Pommer | |
| 6,666,990 B2 | 12/2003 | Shepherd et al. | 252/299.62 |
| 6,690,362 B1 * | 2/2004 | Motoyama et al. | 345/173 |
| 6,713,215 B2 | 3/2004 | Watanabe et al. | 429/231.5 |
| 6,796,851 B2 * | 9/2004 | Trogisch et al. | 439/722 |
| 6,986,965 B2 | 1/2006 | Jenson et al. | |
| 6,987,307 B2 | 1/2006 | White et al. | 257/508 |
| 7,045,246 B2 | 5/2006 | Simburger et al. | 429/124 |
| 7,083,877 B2 | 8/2006 | Iwamoto et al. | 429/233 |
| 7,105,106 B2 | 9/2006 | Samuels et al. | 252/299.01 |
| 7,260,890 B2 | 8/2007 | White et al. | 29/830 |
| 7,394,039 B2 | 7/2008 | Yanagi et al. | |
| 7,553,582 B2 | 6/2009 | Bates | |
| 8,161,633 B2 | 4/2012 | Shacklette et al. | |
| 2002/0004167 A1 | 1/2002 | Jenson et al. | |
| 2003/0010376 A1 | 1/2003 | Yamaguchi et al. | 136/251 |
| 2003/0036790 A1 | 2/2003 | Corbett, III et al. | 607/137 |
| 2003/0121767 A1 * | 7/2003 | Caldwell | 200/512 |
| 2005/0205294 A1 | 9/2005 | Yamashita et al. | |
| 2006/0032046 A1 | 2/2006 | Nathan et al. | 29/623.5 |
| 2006/0104037 A1 * | 5/2006 | Smith et al. | 361/728 |
| 2007/0172722 A1 | 7/2007 | Nishide et al. | 429/53 |
| 2007/0209920 A1 | 9/2007 | Yanagi et al. | |
| 2008/0003493 A1 | 1/2008 | Bates | 429/66 |
| 2008/0061808 A1 * | 3/2008 | Mok et al. | 324/758 |
| 2008/0107833 A1 | 5/2008 | Onodera et al. | |
| 2008/0244898 A1 | 10/2008 | Shacklette et al. | 29/830 |
| 2009/0185357 A1 | 7/2009 | Rendek, Jr. et al. | |
| 2009/0186169 A1 | 7/2009 | Shacklette et al. | |
| 2012/0011715 A1 | 1/2012 | Shacklette et al. | |

FOREIGN PATENT DOCUMENTS

| | | | |
|---|---|---|---|
| EP | 1081729 | 3/2001 | H01H 13/70 |
| EP | 1087415 | 3/2001 | H01H 13/70 |
| JP | 2000208946 A | 7/2000 | |
| JP | 2000208946 * | 8/2000 | |
| WO | 2005084090 A1 | 9/2005 | |
| WO | 2006051693 A1 | 5/2006 | |

OTHER PUBLICATIONS

"Gore™ Speedboard® C Prepeg", W.L. Gore & Associates, 11 pp., 2007, available at http://www.gore.com/en_xx/products/electronic/dielectric/gore_speedboard_c_prepreg.html.

"BT Resin, Glass Fabrics Copper Glad Laminates", Mitsubishi International Corporation, 2 pages, 2007, available at http://www.mic-chem.com/products/BtResin.htm.

Liszewski, "http://www.ohgizmo.com/2006/11/29/the-annoy-a-tron/", 2006, 1 page.

Emsnow Rogers release Aug. 22, 2005, 2 pages.

* cited by examiner

THREE-DIMENSIONAL LIQUID CRYSTAL POLYMER MULTILAYER CIRCUIT BOARD INCLUDING MEMBRANE SWITCH AND RELATED METHODS

FIELD OF THE INVENTION

The present invention relates to the field of circuit boards, and, more particularly, to circuit boards including a membrane switch provided therein and related methods.

BACKGROUND OF THE INVENTION

An electronic device may include one or more circuit boards. A typical circuit board is a two-dimensional (2D) planar board that mechanically supports electronic components. The electronic components may comprise, for example, resistors, capacitors, switches, batteries, and other more complex integrated circuit components, i.e. microprocessors. The circuit board typically comprises a dielectric material, for example, a plastic material.

The circuit board may include conductive traces on the surface for connecting the electronic components to each other. As electronic circuitry has become more complex, multilayer circuit boards with at least two electrically conductive pattern layers have been developed. Typically, the different conductive trace layers of a multilayer circuit board may be connected through vertically extending vias, which comprise conductive materials, for example, metal. A typical multilayer circuit board may comprise a plurality of core layers with bonding layers therebetween affixing the adjacent core layers together. Each core layer typically includes a dielectric layer with electrically conductive pattern layers on the opposing surfaces of the dielectric layer. Typically, during manufacture of the multilayer circuit boards, the core and bonding layers are stacked together and then heated (laminated) to cause the bonding layer to affix the adjacent core layers together.

Even with the advent of the multilayer circuit board, as the mounted circuitry has become even more complex, the size of the circuit board and associated packaging has also increased. This increase in size may pose installation drawbacks in applications where space may be limited or where fitting a planar two-dimensional circuit board may be problematic. Three-dimensional (3D) circuit boards are an approach to this drawback of typical 2D planar circuit boards. As with the typical planar multilayer circuit board, the typical 3D circuit board may comprise a plurality of core layers with bonding layers therebetween affixing adjacent layers together.

Advantageously, 3D circuit boards may perform functions beyond the traditional mechanical support and electrical connection functions of the 2D circuit board. In other words, the 3D circuit board may be a multifunctional structure. For example, the 3D circuit board may perform mechanical, aerodynamic, and encapsulation functions.

Another approach to growth in circuit board size is integrating external electronic components into the circuit board, for example, batteries, and switches. For example, U.S. Pat. No. 7,045,246 to Simburger et al. discloses a thin film battery embedded in a multilayer thin film flexible circuit board. The circuit board comprises polyimide material, which may have some undesirable material characteristics.

One method to forming 3D circuit boards is disclosed in U.S. patent application Ser. No. 11/695,685 to Shacklette et al., also assigned to the assignee of the present invention, which is incorporated in its entirety by reference. The method includes thermoforming core layers individually on a 3D mold structure, stacking the thermoformed core layers, and laminating the stacked thermoformed layers at even a greater temperature. One possible drawback of this method is the two-step heating and cooling process increases manufacturing time and limits productivity.

SUMMARY OF THE INVENTION

In view of the foregoing background, it is therefore an object of the present invention to provide an electronic device with a multilayer circuit board including a membrane switch therein having effective sealing and good electrical properties.

This and other objects, features, and advantages in accordance with the present invention are provided by an electronic device including a multilayer circuit board having a non-planar three-dimensional shape defining a membrane switch recess therein. The multilayer circuit board may include at least one liquid crystal polymer (LCP) layer, and at least one electrically conductive pattern layer thereon defining at least one membrane switch electrode adjacent the membrane switch recess to define a membrane switch. The electronic device may further include a compressible dielectric material filling the membrane switch recess. The electronic device may also include at least one spring member within the membrane switch recess. Advantageously, the multilayer circuit board may provide a hermetic seal for the membrane switch recess therein.

Additionally, the electronic device may further comprise circuitry carried by the multilayer circuit board and being coupled to the membrane switch. The at least one LCP layer may further comprise at least one pair thereof, and the multilayer circuit board may further comprise a bonding layer between the at least one pair of LCP layers. In certain embodiments, the bonding layer may comprise a curable bonding layer. In other embodiments, the bonding layer may comprise a thermoplastic bonding layer.

Another aspect is directed to a method for making an electronic device comprising forming a multilayer circuit board having a non-planar three-dimensional shape defining a membrane switch recess therein. The multilayer circuit board may comprise at least one liquid crystal polymer (LCP) layer, and at least one electrically conductive pattern layer thereon defining at least one membrane switch electrode adjacent the membrane switch recess to define a membrane switch of the electronic device. The electrically conductive pattern layer may comprise at least one of copper, nickel, silver, gold, indium, lead, tin, carbon, and aluminum.

Moreover, the method may further comprise mounting circuitry on the multilayer circuit board, the circuitry being coupled to the membrane switch. The at least one LCP layer may comprise at least one pair thereof, and the multilayer circuit board may further comprise a bonding layer between the at least one pair of LCP layers.

Furthermore, the forming of the multilayer circuit board may comprise forming a stacked arrangement comprising at least one pair of LCP layers with a bonding layer therebetween. The forming of the multilayer circuit board may also comprise heating and applying pressure to the stacked arrangement to shape the stacked arrangement into a non-planar three-dimensional shape and concurrently causing the bonding layer to bond together the adjacent LCP layers of the stacked arrangement. Each of the LCP layers may have a melting temperature, and the bonding layer may have a bonding temperature less than the melting temperature of each of the LCP layers.

In certain embodiments, the bonding layer may comprise a curable bonding layer, and the bonding temperature may comprise a curing temperature for the curable bonding layer. In other embodiments, the bonding layer may comprise a thermoplastic bonding layer, and the bonding temperature may comprise a melting temperature for the thermoplastic bonding layer. The forming of the stacked arrangement may comprise initially forming a stacked planar arrangement.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
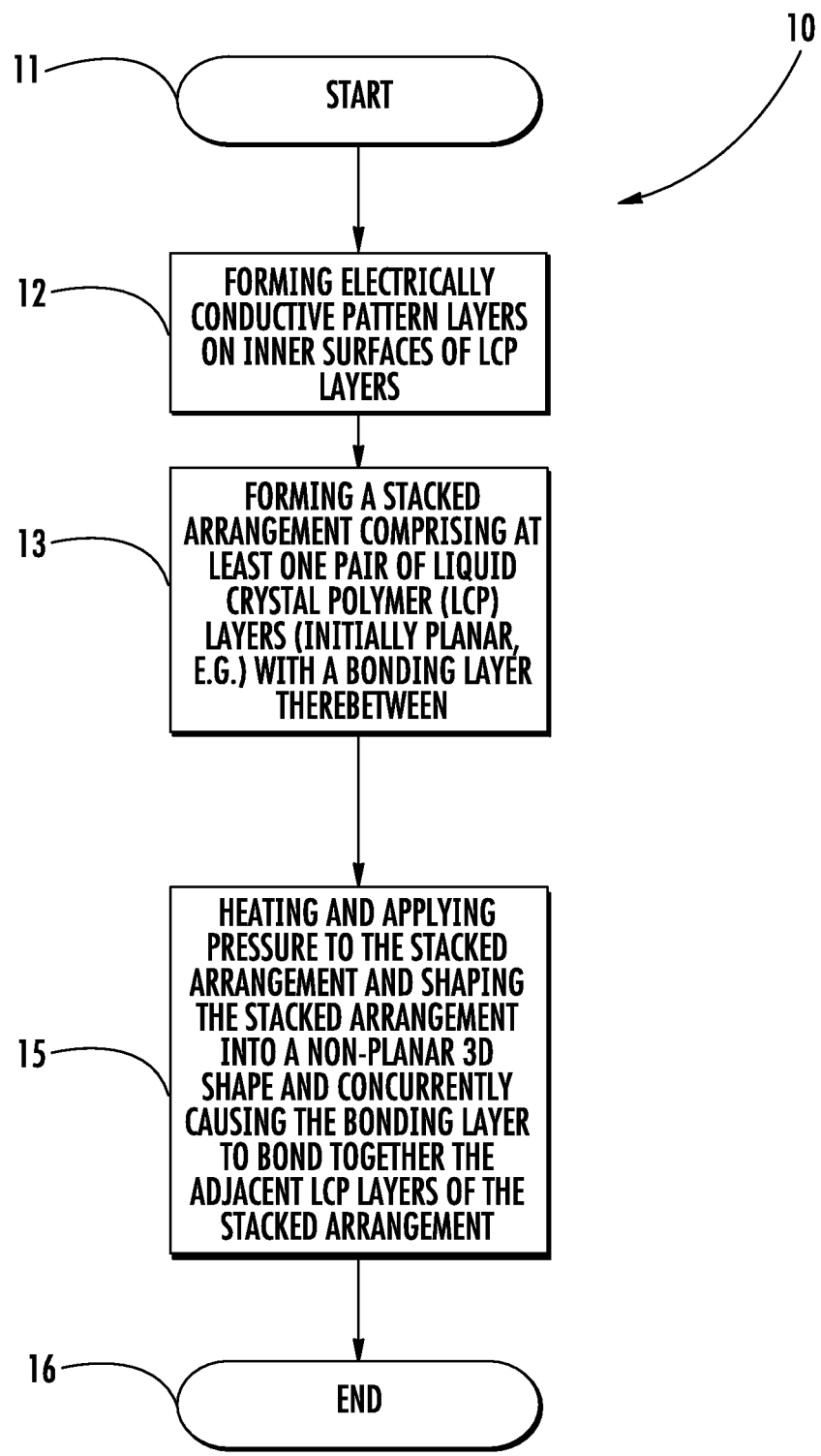
FIG. 1 is a flowchart illustrating a method for making a non-planar 3D multilayered circuit board according to the present invention.
Figure 2:
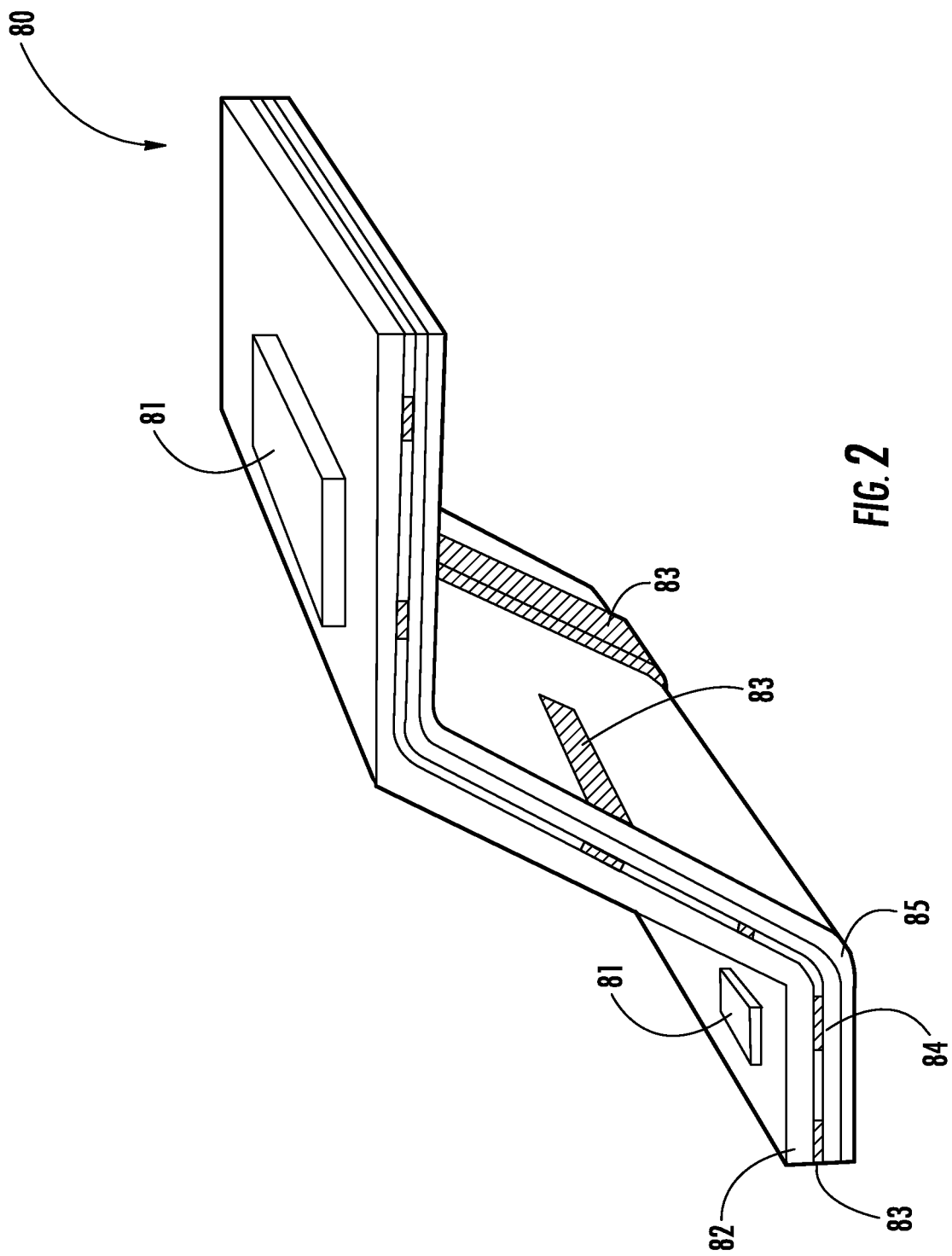
FIG. 2 is a perspective view of a non-planar 3D multilayer circuit board made according to the method of FIG. 1.

Referring initially to FIGS. 1-2, a flowchart 10 illustrates a method for making a non-planar three-dimensional (3D) multilayer circuit board 80. From the start (Block 11), the method illustratively includes forming (Block 12) a electrically conductive pattern layer 83 on inner surfaces of liquid crystal polymer (LCP) layers 82, 85, and forming (Block 13) a stacked arrangement, which may be initially planar, the stacked arrangement comprising at least one pair of the LCP layers 82, 85 with a bonding layer 84 therebetween.

The electrically conductive pattern layer 83 is illustratively formed on each LCP layer 82, 85. As will be appreciated by those skilled in the art, the electrically conductive pattern layer 83 may be stripped thereafter. In some embodiments, the electrically conductive pattern layer 83 may be formed on a single LCP layer 82, 85. As will be appreciated by those skilled in the art, the multilayer circuit board 80 may be defined by the number of the electrically conductive pattern layers 83 thereon.

The LCP layers 82, 85 may comprise, for example, Rogers F/flex® 3600, 3850 core material layers or Nippon Steel Espanex L, Std-Type core material layers. Each of the LCP layers may comprise a biaxially oriented LCP layer. Advantageously, the biaxially oriented LCP layers have low values for the X and Y coefficients of thermal expansion (CTE) and relatively high values for the Z CTE. For example, Rogers F/flex® 3600 and 3850 both have X, Y, and Z values for CTE of 17 ($10^{-6}*1/°$ C.), 17 ($10^{-6}*1/°$ C.), and 150 ($10^{-6}*1/°$ C.), respectively.

Advantageously, LCP has electrical properties that may helpful for use in the 3D multilayer circuit 80 board. For example, Rogers F/flex® 3600 and 3850 both have a low dielectric constant of 2.9 and a loss tangent at 10 GHz of 0.0025. Moreover, LCP (Rogers F/flex® 3600/3850 and or Nippon Steel Espanex L) has hermetic properties and a low water uptake of 0.04%, and a Young modulus of in the range of 2400-3000 MegaPascals. Advantageously, LCP provides a mechanically robust dielectric material. Moreover, the low loss tangent provides for lower losses in high frequency circuitry, and the lower dielectric constant provides the ability to reduce line spacing and create more compact circuit layouts.

The stacked arrangement illustratively includes the electrically conductive pattern layer 83, for example, metal traces, on each of the LCP layers 82, 85. The electrically conductive pattern layer 83 may comprise at least one of copper, nickel, silver, gold, indium, lead, tin, carbon, and aluminum or an alloy thereof. For example, the electrically conductive pattern layer 83 may comprise a base metal layer of one type and a second metal layer of a second type thereon, in other words, a multilayer composite.

The electrically conductive pattern layer 83 may be applied to some or all of the LCP layers 82, 85 before or after the thermoforming and lamination step. As will be appreciated by those skilled in the art, applying the electrically conductive pattern layer 83 to the inner surfaces of the LCP layers 82, 85 may need to be performed before the thermoforming and lamination step.

In certain 3D forms with high aspect ratios, forming the electrically conductive pattern layers 83 before the thermoforming and lamination step may be more difficult. In these high aspect ratio 3D circuit boards, the electrically conductive pattern layers 83 may be formed thereafter using, for example, inkjet printing or silk screening. As will be appreciated by those skilled in the art, the electrically conductive pattern layer 83 may comprise any material with suitable conductivity properties. Advantageously, the low value of X-Y CTE and high value of X-Y tensile modulus for the LCP layers may prevent breaks and discontinuities in the electrically conductive pattern layer 83 during the thermoforming and lamination step. Indeed, the linear (XY) CTE of copper is 17 ($10^{-6}*1/°$ C.), which advantageously matches the X-Y CTE of the LCP layers.

Further advantage stems from the thermoforming step being carried out at a temperature that is significantly below the melting point and approximately equal to or even as much as 30° C. below the glass transition temperature of the LCP core layers. Under such conditions, the LCP core layers retain a modulus significantly higher than that of the bonding layer 84, a condition that will act to limit and more uniformly spread the deformation of the LCP layers 82, 85 and the copper traces thereupon, thereby reducing the chances for a break in the copper traces 83 caused by excessive elongation.

The method illustratively includes heating and applying pressure to the stacked arrangement to shape the stacked arrangement into a non-planar 3D shape and concurrently causing (Block 15) the bonding layer 84 to bond together the adjacent LCP layers 82, 85 of the stacked arrangement to thereby form the non-planar 3D multilayer circuit board. The method ends at (Block 16), an exemplary multilayer circuit board 80 with circuitry 81 thereon being shown in FIG. 2. In other words, the multilayer circuit board is thermoformed and laminated in one step.

Additionally, the heating (Block 15) may comprise heating in a range of 170 to 230° C. Preferably, the heating (Block 15) may comprise heating in a range of 180 to 220° C. As will be appreciated by those skilled in the art, the low temperature bound is determined by the respective temperature that provides adequate plasticity in the LCP layers 82, 85 for thermoforming. In other words, the LCP should be flexible enough to be shaped or have sufficient plasticity to deform under pressure or vacuum. The high temperature bound is determined by the respective temperature that generates excessive plasticity or fluidity in the LCP layers 82, 85, thereby causing the LCP layers to excessively and/or unevenly deform during thermoforming. The high temperature limit may depend on the particular choice of LCP material, since the glass transition temperature and the melting point generally vary with the particular grade or manufacturer. It is generally preferred to perform the process at the lowest temperature that produces the desired permanent shape. A preferred temperature range is from about 180° C. to 220° C. The heating (Block 15) may further comprise increasing the temperature at a constant rate and subsequently decreasing the temperature at a constant rate, for example, 5° C. per minute and 10° C. per minute, respectively.

Applying pressure (Block 15) may comprise applying pressure using at least one of a vacuum bag and a press mold, as will be appreciated by those skilled in the art. The pressure range may be 50-200 pounds per square inch (psi), for example. Preferably, the pressure range is about 80-120 psi. As will be appreciated by those skilled in the art, performing the concurrent thermoforming and lamination step at the low pressure bound may require a greater process temperature, and performing the concurrent thermoforming and lamination step at the higher pressure bound may require a lower process temperature.

Moreover, each of the LCP layers 82, 85 has a glass transition temperature and a melting temperature above the glass transition temperature. Near or above the glass transition temperature, the LCP layers 82, 85 have a plasticity value for permitting thermoforming. The bonding layer 84 has a bonding temperature that is significantly below the melting point and approximately equal to or even slightly below the glass transition temperature of the LCP layers 82, 85. Advantageously, the steps of bonding/laminating the bonding layer and thermoforming the 3D multilayer circuit board 80 may be concurrently performed since the process temperature of the bonding layer 84 and the glass transition temperature of the LCP layers are within range.

As will be appreciated by those skilled in the art, the layers of the 3D multilayer circuit board 80 may be precisely aligned to fit circuit board features of one layer to the appropriate features in adjacent layers. For example, the layers may have alignment holes drilled in them before/after the thermoforming and lamination step, the holes being aligned with posts in the press mold to be used in either a mechanical press or within a vacuum bag subject to heat and pressure within an autoclave.

In some embodiments, the bonding layer 84 may comprise a curable bonding layer, and the bonding temperature may comprise a curing temperature for the curable bonding layer. For example, the bonding layer 84 may comprise a Bismaleimide-Triazine (BT) resin. For example, in these embodiments, the bonding layer may comprise Gore Speedboard® C/LF preimpregnated thermoset bonding layers. The process/curing temperature of the Gore Speedboard® C/LF preimpregnated thermoset bonding layers is recommended to be about 180-220° C. As will be appreciated by those skilled in the art, other curable bonding layers having a process/curing temperature within range of the glass transition temperature of LCP may be used.

In other embodiments, the bonding layer 84 may comprise a thermoplastic bonding layer, and the bonding temperature may comprise a melting temperature for the thermoplastic bonding layer. Furthermore, the bonding layer 84 may comprise, for example, a thermoplastic, such as, chlorotrifluoroethylene (CTFE). For example, in these embodiments, the thermoplastic bonding layer may comprise Arlon® 6250 bonding layers. The process/melting temperature of the Arlon® 6250 bonding layers is within the range of 120-150° C. As will be appreciated by those skilled in the art, other thermoplastic bonding layers, such as, Arlon® 6700 or Rodgers® 3001, having a process/melting temperature within range of the glass transition temperature of LCP may be used.

Figure 3:
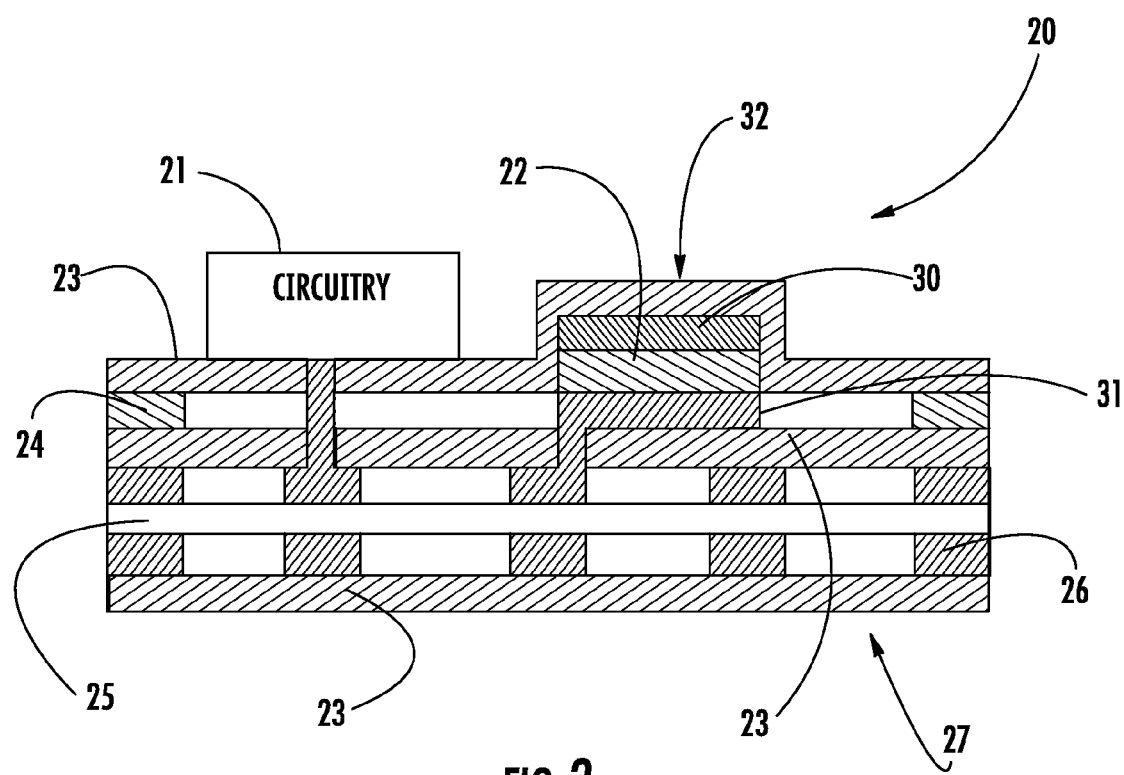
FIG. 3 is a schematic cross-sectional diagram of an electronic device according to the present invention.

Referring now to FIG. 3, an exemplary electronic device 20 is now described. The electronic device 20 illustratively includes a multilayer circuit board 27 having a non-planar three-dimensional shape defining a battery component receiving recess 32 of the electronic device therein. The battery component receiving recess 32 may receive, for example, active materials, electrolytes 22, spacers, an anode, a cathode, and current collectors. The LCP layers 23 may function to provide environmental packaging as well as a substrate for circuitry 21 that also comprises the electronic device 20.

As will be appreciated by those skilled in the art, the non-planar three-dimensional shape defining a battery component receiving recess 32 therein may be manufactured using the method for making a non-planar 3D multilayered circuit board described above. Alternatively, other methods of thermoforming may be used as will also be appreciated by those skilled in the art, for example, the two step lamination and thermoforming process disclosed in U.S. patent application Ser. No. 11/695,685 to Shacklette et al.

The multilayer circuit board 27 illustratively includes a plurality of LCP layers 23, and a plurality of electrically conductive pattern layers 26 on some of or all of the LCP layers. The electrically conductive pattern layers 26 define a pair of battery electrodes (contacts) 31, 30 adjacent the battery component receiving recess 32. The electrically conductive pattern layers 26 may comprise at least one of copper and aluminum, for example. More specifically, the battery contacts 31, 30 include a cathode contact 30 comprising aluminum and an anode contact 31 comprising copper. As will be appreciated by those skilled in the art, other conductive metals may be used.

In some embodiments (not shown), the multilayer circuit board may include a single LCP layer, and a metal foil layer thereon sealing the battery component receiving recess and the components contained therein. The metal foil layer may comprise, for example, gold, copper, nickel, iron, cobalt, aluminum, molybdenum, silver, zinc, titanium, and alloys thereof. Preferably, the metal foil may comprise copper, aluminum or stainless steel, or one of those metals plated or coated by a second metal.

The electronic device 20 may further include anode and cathode active materials, an insulating spacer, optional metal current collectors, and a battery electrolyte 22 within the battery component receiving recess 32. The battery electrolyte 22 may contact the battery electrode contacts 31, 30 to define a battery, and with the multilayer circuit board 27 defining exterior portions for the battery. Moreover, the battery electrolyte 22 may comprise lithium ion electrolyte, for example.

Advantageously, the electrolyte receiving recess 32 may define the boundaries of the battery components, for example, the electrolyte 22, the anode and cathode active materials, the insulating spacer, the metal current collectors. In other words, the bare battery electrolyte 22 and other battery components may be integrated into the multilayer circuit board 27 without the typical packaging, for example, foil packaging. In other embodiments, the battery electrolyte 22 and other battery components may be integrated into the multilayer circuit board 27 with the typical packaging. The components of the battery, such as, current collectors, electrodes, and spacers, may be stacked between the LCP layers 23 prior to lamination, and the subsequent lamination step may both form the LCP around the battery stack and both laminate the multilayer circuit board 27 and seal the battery components in one step.

As will be appreciated by those skilled in the art, the battery electrolyte 22 may comprise other electrolyte types. Moreover, the electrolyte 22 may be inserted into the battery component receiving recess 32 after thermoforming and lamination of the LCP layers 23, for example, using an opening 28 (FIGS. 6-12) in the battery component receiving recess. Alternatively, the electrolyte packaged cell may be used and inserted before finishing the battery component receiving recess 32. The battery electrolyte 22 may comprise a solid electrolyte or alternatively liquid electrolyte. In embodiments of the electronic device 20 where the non-planar three-dimensional shape defining the battery component receiving recess 32 is manufactured using the method for making a non-planar 3D multilayered circuit board described above, a solid electrolyte may be use and positioned in the LCP layers 23 before lamination. As will be appreciated by those skilled in the art, the battery electrolyte 22 may be stable at the thermoforming temperature. Alternatively, if using a liquid electrolyte, the LCP layers 23 may need to be laminated prior to injection through the opening 28 of the liquid electrolyte due to the high temperature of the thermoforming process and the likely instability of the liquid electrolyte during the thermoforming process.

Additionally, the electronic device 20 illustratively includes circuitry 21 carried by the multilayer circuit board 27 and receiving power from the battery, which may be a rechargeable battery or a one-time use battery. The circuitry 21 may comprise, for example, passive components, display components, or/and active components, such as, an integrated circuit, etc. The multilayer circuit board 27 illustratively includes a bonding layer 25 between the LCP layers 23. In certain embodiments, the bonding layer 25 may comprise a curable bonding layer. In other embodiments, the bonding layer 25 may comprise a thermoplastic bonding layer. The electronic device also includes illustratively a perimeter seal 24, which may be the same as or different from the bonding layer 25, but may be processed within the same temperature window that allows the lamination and the shaping of the electronic device 20.

Figure 4:
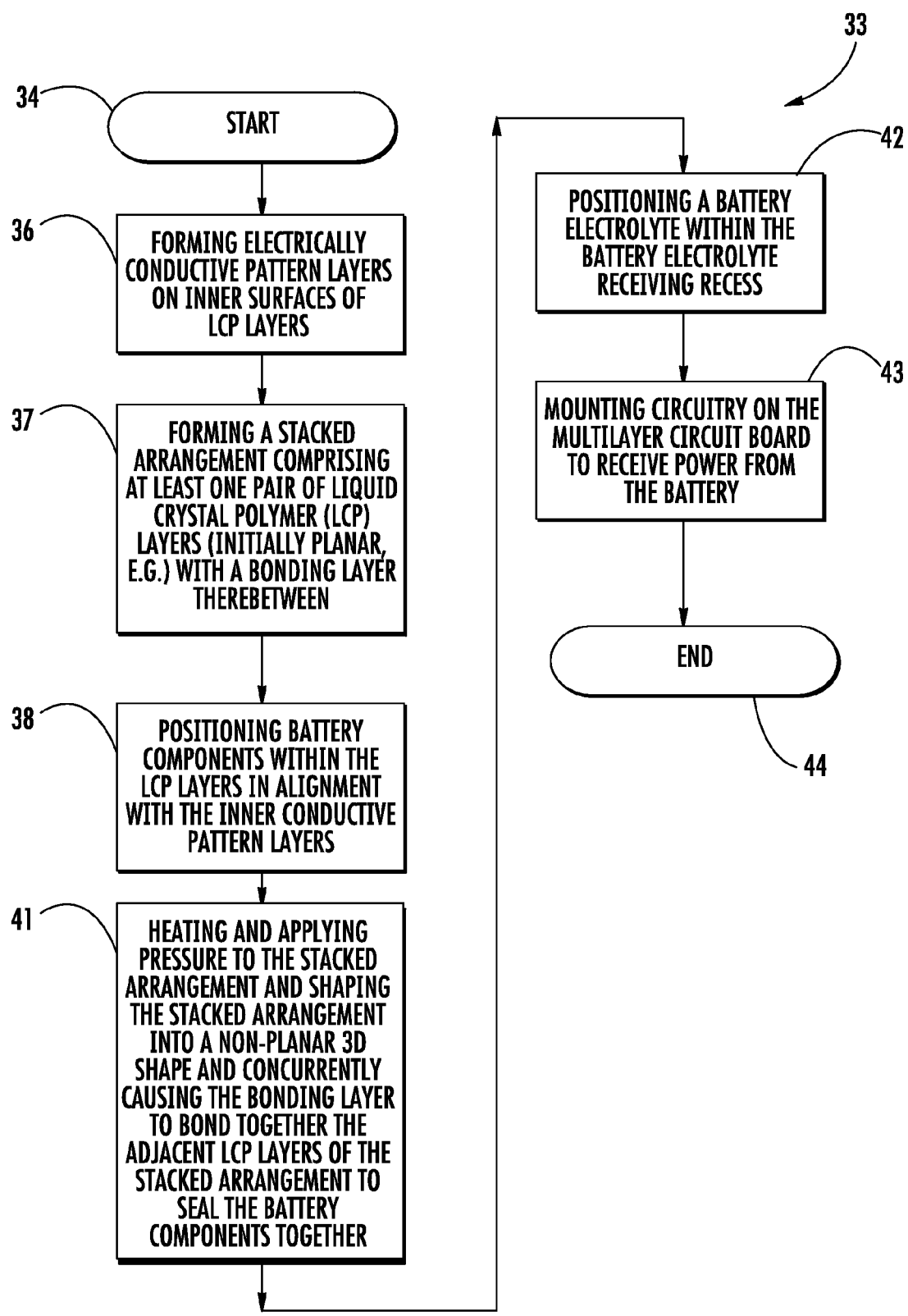
FIG. 4 is a flowchart illustrating a method for making the electronic device of FIG. 3.
Figure 5:
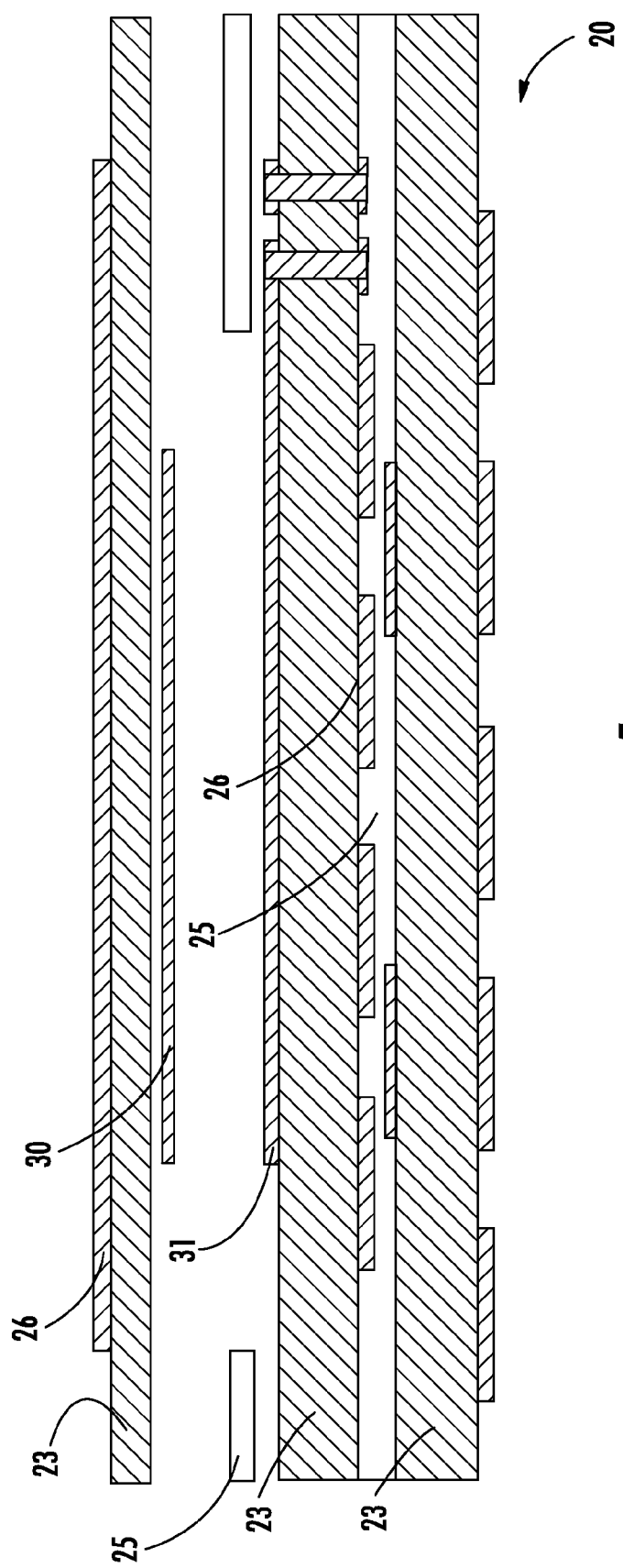
FIGS. 5-12 illustrate an embodiment of the method for making the electronic device of FIG. 3

Referring now also to FIG. 4, a flowchart 33 illustrates a method for making an electronic device 20. From the start (Block 34), the method illustratively begins with forming electrically conductive pattern layers 26 on inner surfaces of the LCP layers 23 (Block 36). The method also includes forming a stacked arrangement, which may be initially planar, the stacked arrangement comprising at least one pair of LCP layers 23 with a bonding layer 25 therebetween (Block 37), and positioning battery components within the LCP layers in alignment with the inner conductive pattern layers 26 (Block 38). The contacts of the electronic device 20 may be coated with solder or conductive adhesives, such that the solders may melt or the adhesives may cure during the lamination and thermoforming step.

The method illustratively includes heating and applying pressure to the stacked arrangement to shape the stacked arrangement into a non-planar 3D shape and concurrently causing (Block 41) the bonding layer 25 to bond together the adjacent LCP layers 23 of the stacked arrangement to thereby form a battery component receiving recess 32, in other words, forming a multilayer circuit board 27 having a non-planar three-dimensional shape defining a battery component receiving recess therein. (Block 41) The multilayer circuit board 27 includes LCP layers 23, and a plurality of electrically conductive pattern layers 26 thereon defining a plurality of battery electrodes 30, 31 adjacent the battery component receiving recess 32.

The method also includes positioning (Block 42) a battery electrolyte 22 within the battery component receiving recess 32 and contacting the battery electrodes 30, 31 to define a battery for the electronic device. As will be appreciated by those skilled in the art, the battery electrolyte 22 may be inserted into the battery component receiving recess 32 further upstream, for example, by thermoforming around a pre-packaged solid electrolyte cell or by including a solid or gel electrolyte among the battery components that can withstand the temperature and pressure of the lamination cycle. The method also illustratively includes mounting (Block 43) circuitry 21 on the multilayer circuit board 27 to receive power from the battery, the method ending at (Block 44).

In another embodiment of the method, a non-planar 3D shape would be created during the process of (Block 41) using appropriate tooling during this combined thermoforming and lamination step. The process step of (Block 41) would then be followed by inserting a pre-packaged battery or full set of battery components into the battery component receiving recess 32 (Block 42) and sealing the battery into the non-planar 3D shape by applying an additional LCP layer 23 held in place by a perimeter seal 24. As will also be appreciated by those skilled in the art, the method described for embedding a battery can be applied to embedding similarly shaped objects, such as, a metal heat spreader or an integrated circuit.

Figure 6:
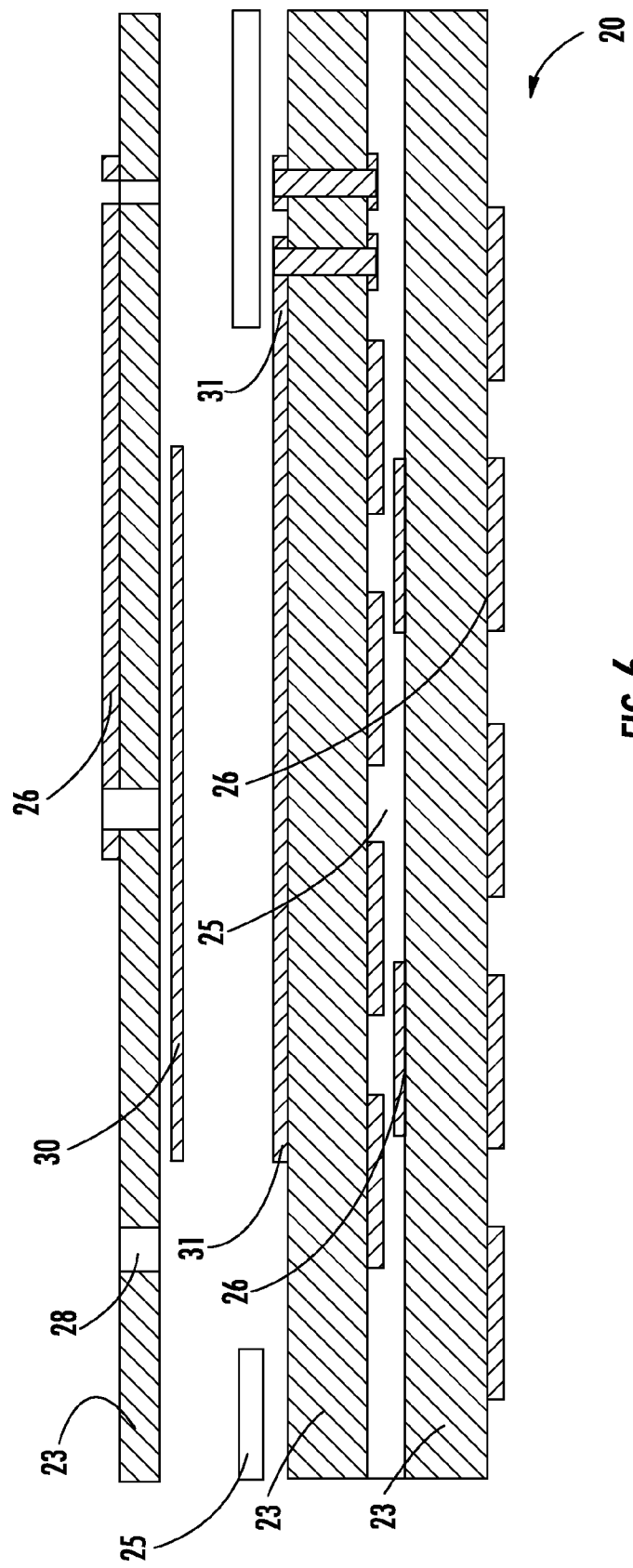

As will be appreciated by those skilled in the art, an exemplary implementation of the method of making the electronic device 20 follows. Referring additionally to FIGS. 5-12, the method is illustrated. Referring specifically to FIG. 6, the vias are formed in the top LCP layer 23, one via forming the opening 28 for subsequent injection of a liquid electrolyte 22.

Figure 7:
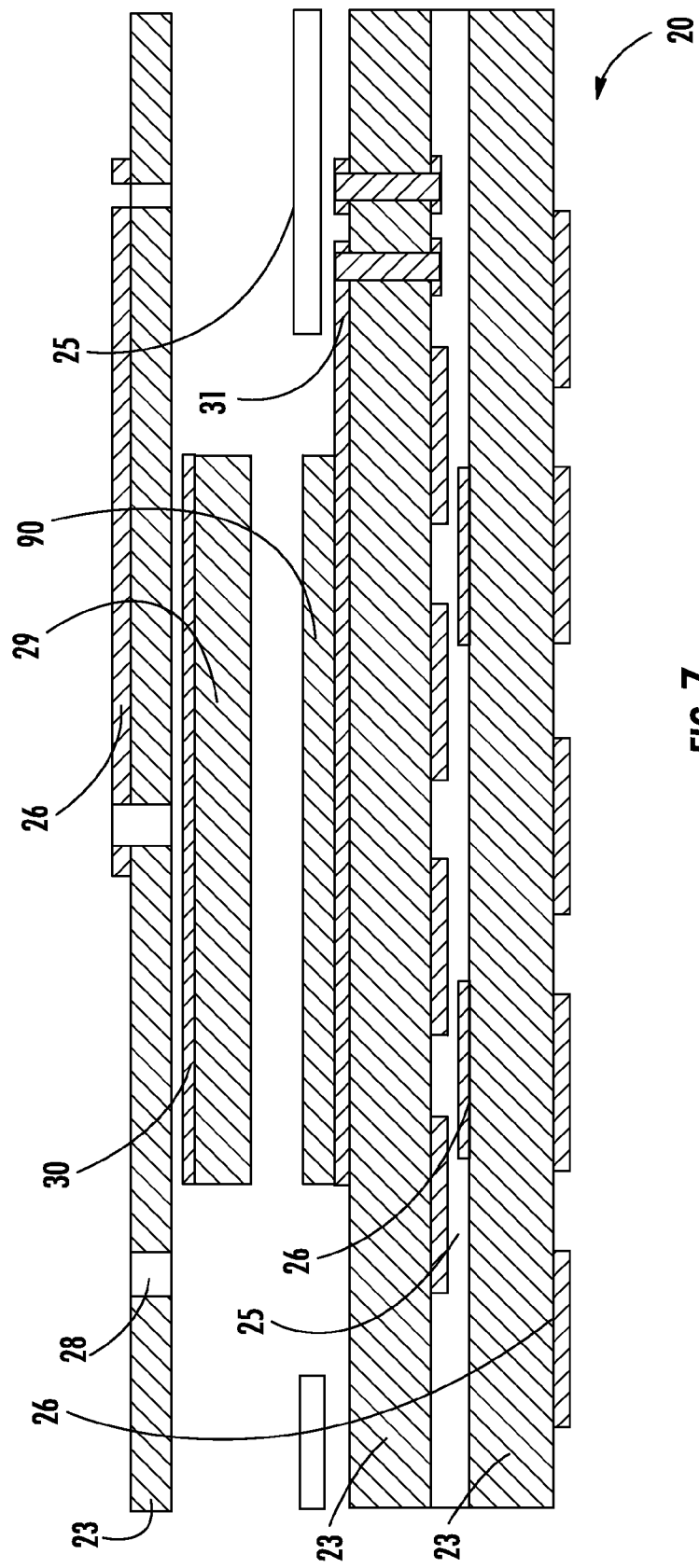
Figure 8:
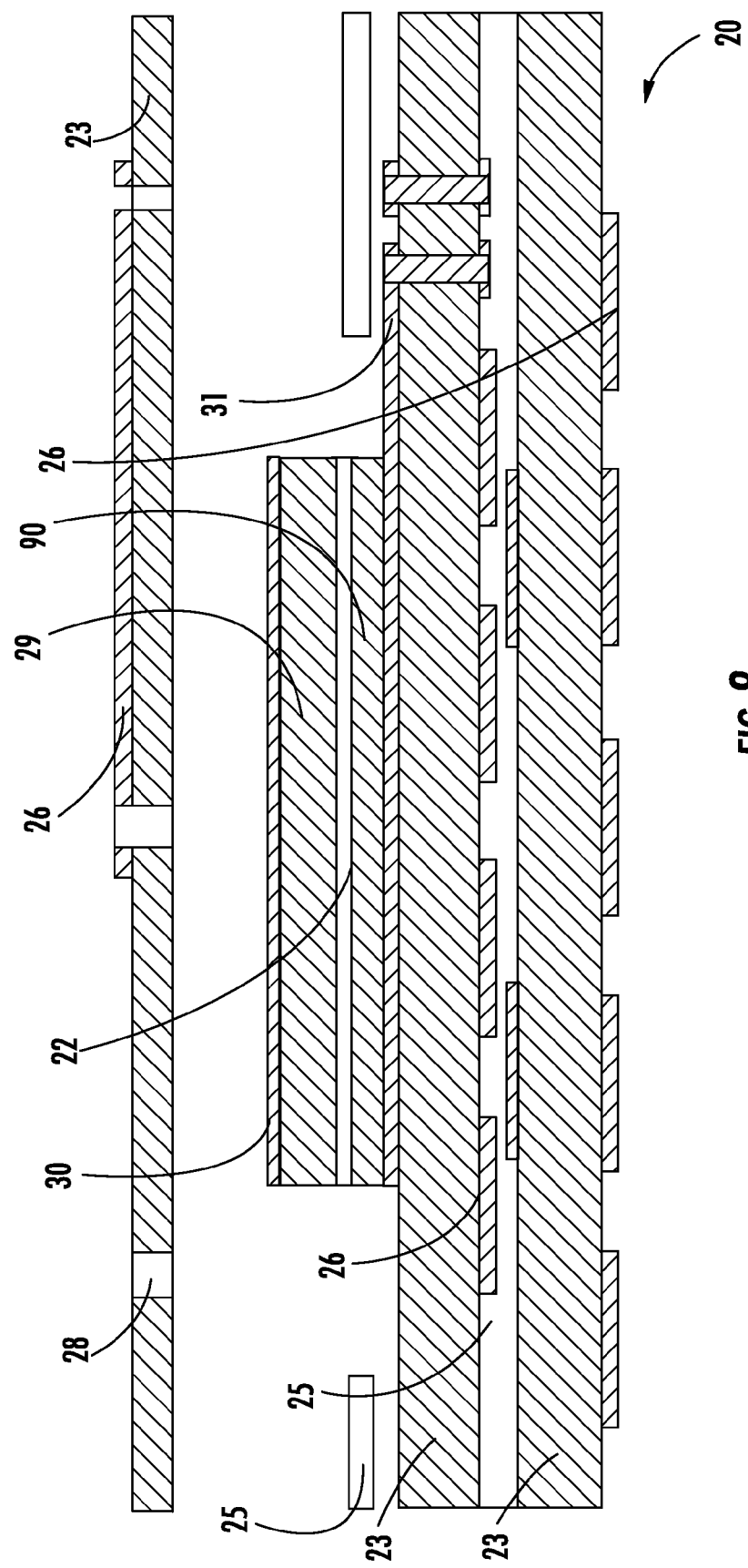
Figure 9:
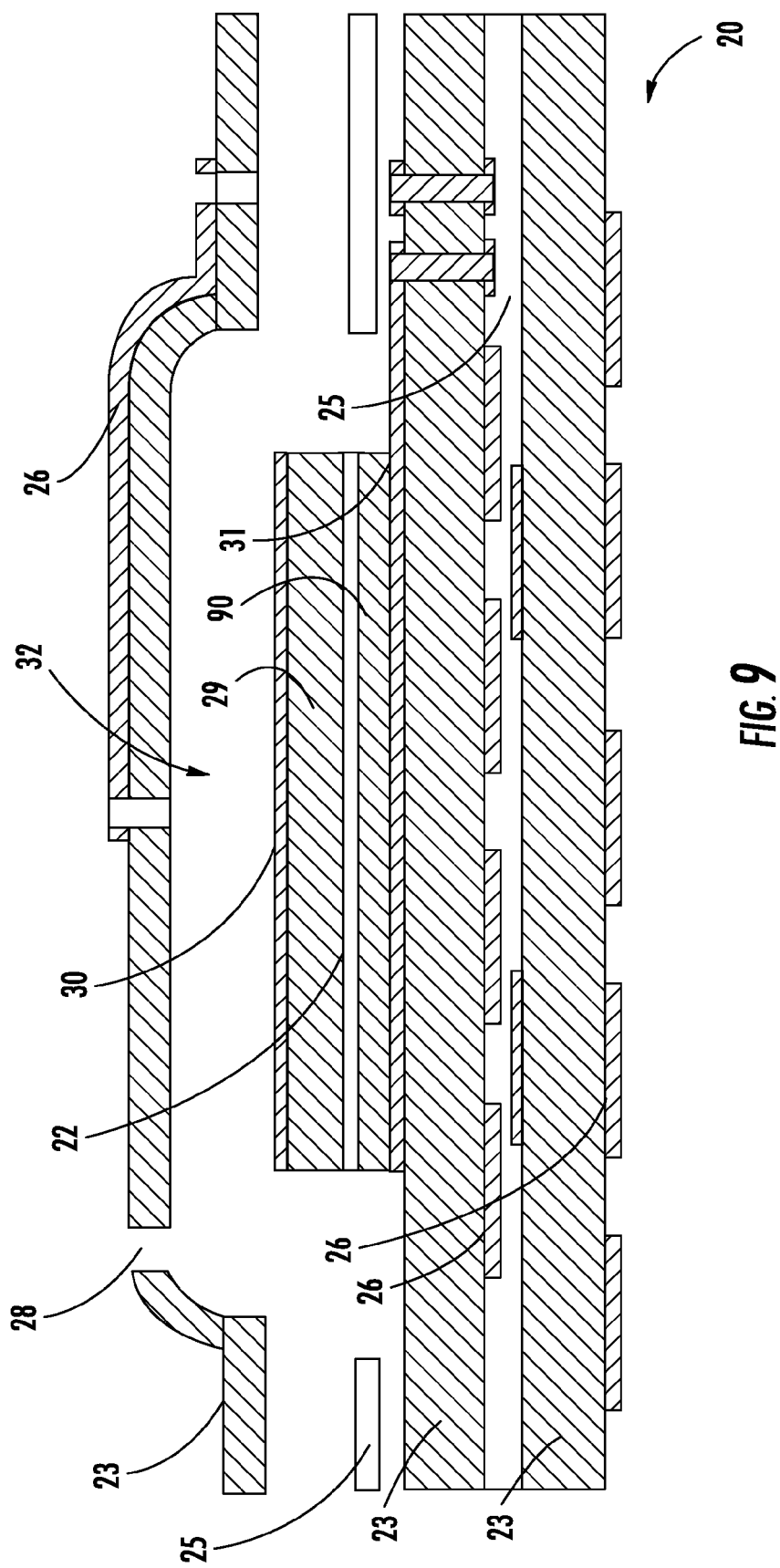
Figure 10:
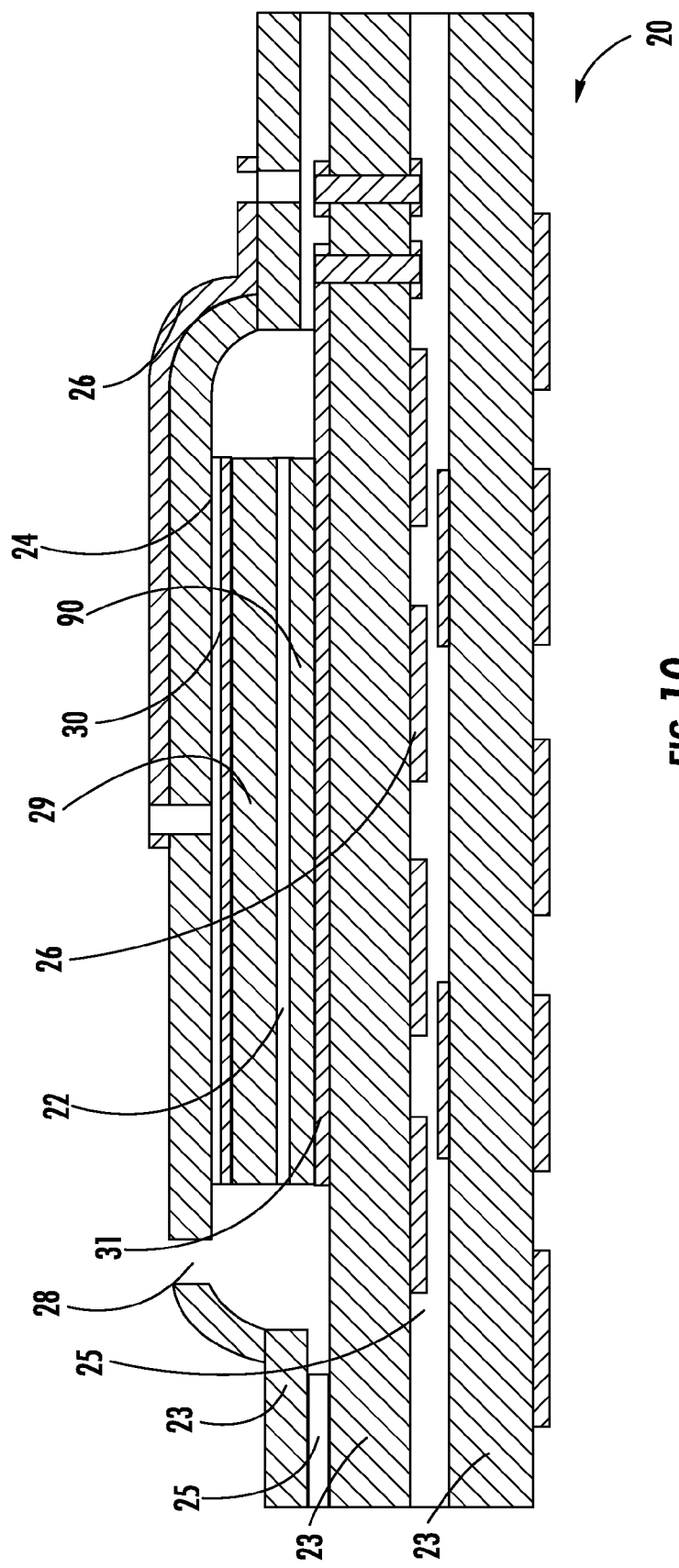
Figure 11:
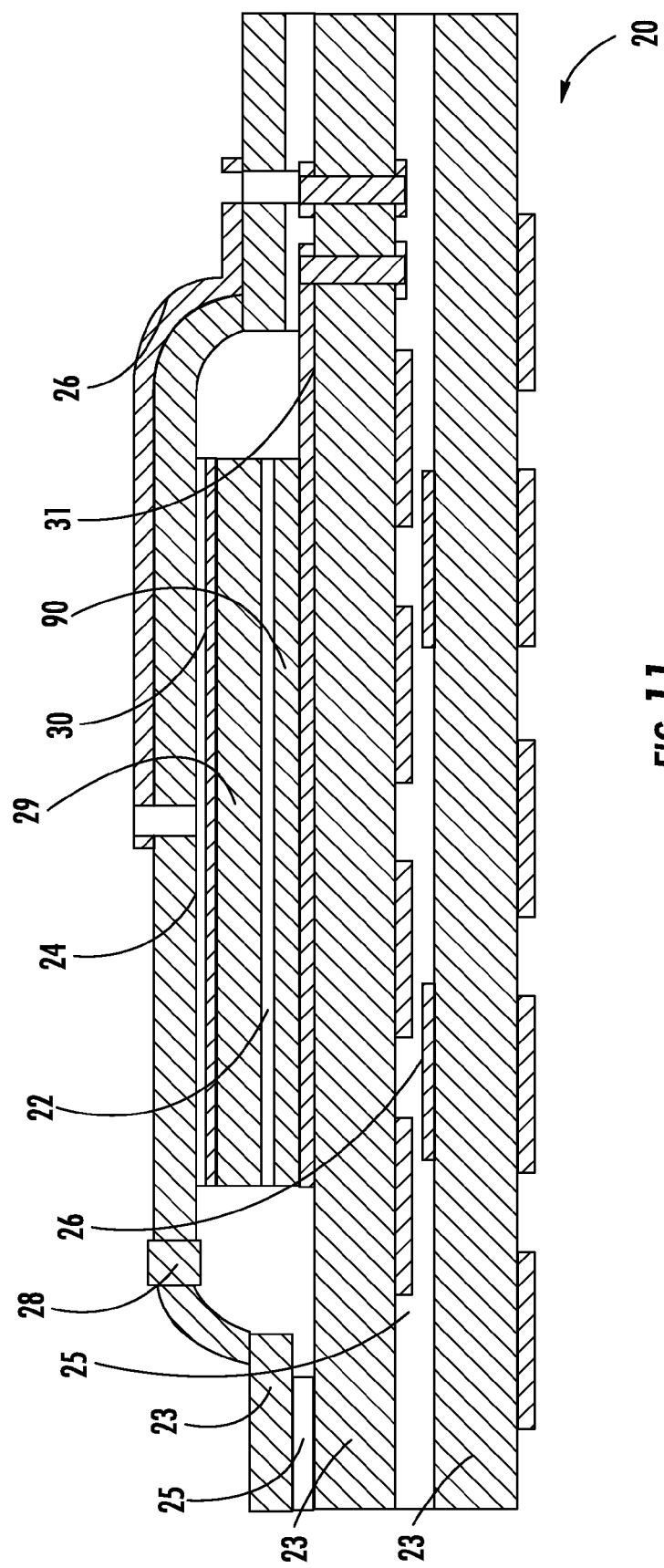
Figure 12:
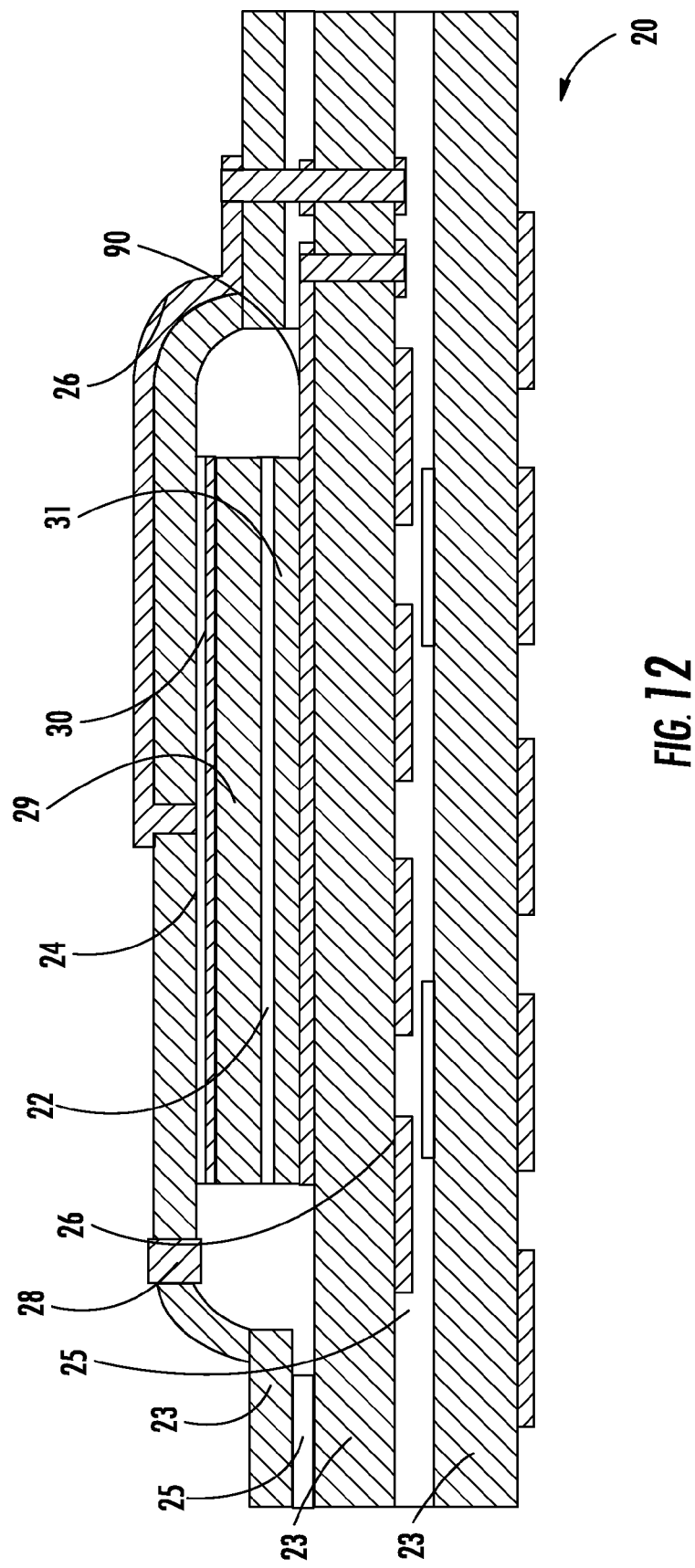

In FIG. 7, a slurry coat is applied and the cathode 30 and the anode 31 are formed out of aluminum and copper cladding, respectively. A lithium cobalt oxide electrode 29 is also formed adjacent the cathode 30. A graphite electrode 90 is also formed respectively adjacent the anode 31. The electrodes are then laminated (FIG. 8) and the battery is stacked-up. Referring specifically to FIG. 9, the top LCP layer 23 is thermoformed to form the battery component receiving recess 32. Referring specifically to FIG. 10, the perimeter seal 24 is laminated on the cathode 30. In FIG. 11, the electrolyte 22, for example, a liquid free gel-polymer electrolyte layer, is filled post thermoforming. The opening is also filled 28 to provide a seal. In FIG. 12, the vias are either hand painted or plated to tie in battery power.

Figure 13:
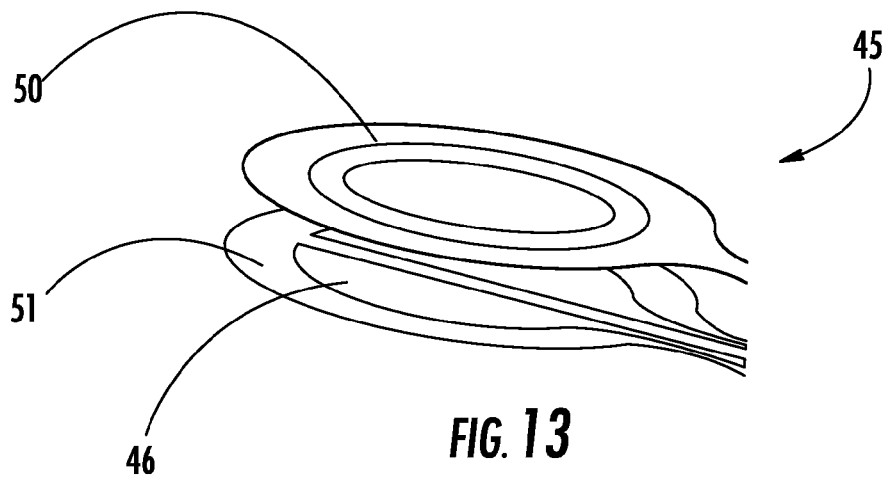
FIG. 13 is an isometric view from the top of another electronic device according to the present invention.
Figure 14:
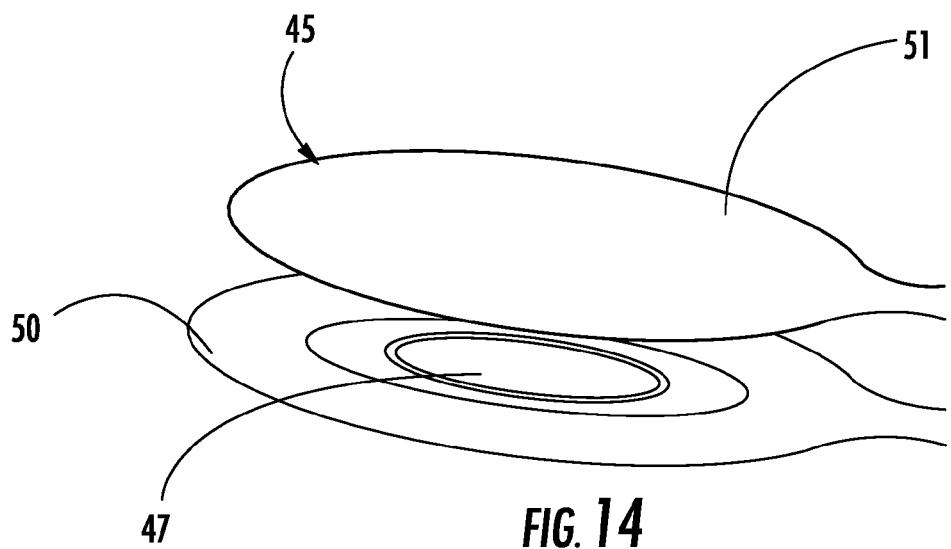
FIG. 14 is a second isometric view from the bottom of the electronic device of FIG. 13.
Figure 15:
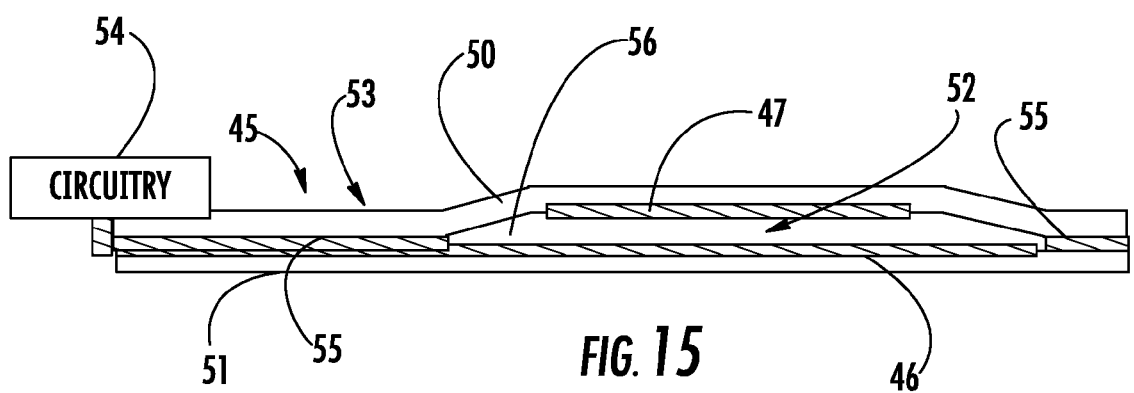
FIG. 15 is a cross-section view of the electronic device of FIG. 13.

Referring now to FIGS. 13-15, another exemplary electronic device 45 is illustrated and illustratively includes a multilayer circuit board 53 having a non-planar three-dimensional shape. The non-planar three-dimensional shape defines a membrane switch recess 52 therein. As will be appreciated by those skilled in the art, the non-planar three-dimensional shape defining the membrane switch recess 52 therein may be manufactured using the method for making a non-planar 3D multilayered circuit board described above. Alternatively, other methods of thermoforming may be used as will also be appreciated by those skilled in the art, for example, the two step lamination and thermoforming process disclosed in U.S. patent application Ser. No. 11/695,685 to Shacklette et al.

The multilayer circuit board 53 illustratively includes a pair of LCP layers 50, 51, and a pair of conductive pattern layers 46, 47 thereon defining a plurality of membrane switch electrodes adjacent the membrane switch recess 52 to define a membrane switch. Advantageously, although typical membrane switch electrodes are plated in gold or nickel to prevent corrosion, since the thermoformed LCP layers 50, 51 provide hermetic or near hermetic properties, the membrane switch electrodes may comprise bare copper with no plating, thereby reducing manufacturing cost and durability.

The electrically conductive pattern layers 46, 47 may comprise at least one of copper, nickel, silver, gold, indium, lead, tin, carbon, and aluminum or an alloy thereof. For example, the electrically conductive pattern layers 46, 47 may comprise a base metal layer of one type and a second metal layer of a second type thereon, in other words, a multilayer composite.

Since it may be helpful to keep the membrane switch recess 52 open during the thermoforming and lamination step, it may be preferred that the lamination be made with a mechanical press that includes a top plate or tooling piece that is machined to produce the desired 3D form of the LCP layer 50. It may be further preferred that the top plate or tool exert a vacuum on the top surface of the LCP layer 50 to ensure that it conforms to the shape of the tooling during the forming and lamination step.

The electronic device 45 may further include a compressible dielectric material filling the membrane switch recess 52. For example, the dielectric filling material may comprise an air pocket. The electronic device 45 may also include at least one spring member 56 within the membrane switch recess 52. Alternatively, certain embodiments may omit the spring member 56 since the thermoformed LCP layers 50, 51 are mechanically elastic and resilient and may return to preformed 3D shape after the membrane switch recess 52 is depressed.

Additionally, the electronic device 45 illustratively includes circuitry 54 carried by the multilayer circuit board 53 and being coupled to the membrane switch. Advantageously, the membrane switch may be coupled to and control the circuitry 54 integrated on the multilayer circuit board 53. The multilayer circuit board 53 includes a bonding layer 55 between the LCP layers 50, 51.

Figure 16:
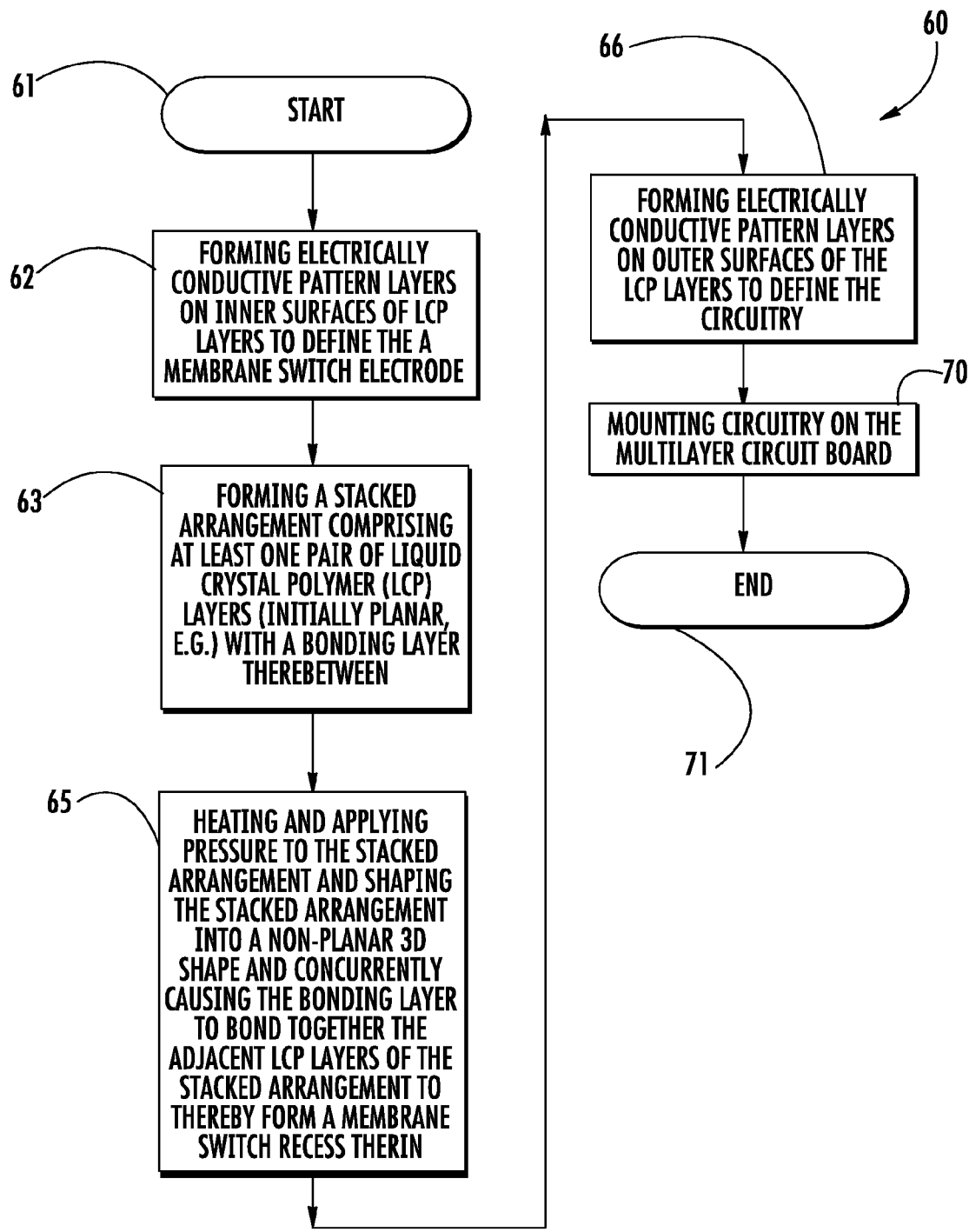
FIG. 16 is a flowchart illustrating a method for making the electronic device of FIG. 13.

Referring now additionally to FIG. 16, a flowchart 60 illustrates a method for making an electronic device 45. From the start (Block 61), the method illustratively begins with forming electrically conductive pattern layers 46, 47 on inner surfaces of LCP layers 50, 51 to define at least one pair of switch electrodes (Block 62). The method also includes forming a stacked, arrangement, which may be initially planar, the stacked arrangement comprising at least one pair of patterned LCP layers 50, 51 with a bonding layer 55 therebetween (Block 63). The stacked arrangement includes at least one electrically conductive pattern layer 46, 47 on each of the LCP layers 50, 51.

The method also includes heating and applying pressure and a selective vacuum to the stacked arrangement, and shaping (Block 65) the stacked arrangement into a non-planar 3D shape and concurrently causing the bonding layer 55 to bond together the adjacent LCP layers 50, 51 of the stacked arrangement to thereby form the 3D multilayer circuit board 53. In other words, the method includes forming a multilayer circuit board 53 having a non-planar three-dimensional shape defining a membrane switch recess 52 therein.

The method illustratively includes forming (Block 66) electrically conductive pattern layers 46, 47 on at least one of the outer surfaces of the LCP layers 50, 51 for defining at least one membrane switch electrode adjacent the membrane switch recess 52 to define a membrane switch, i.e. to complete the circuit interconnects and optionally to connect to any surface mount components or circuitry 54. As will be appreciated by those skilled in the art, the electrically conductive pattern layers 46, 47 may be formed further upstream in the method, for example, during the process at Block 62. Moreover, the method illustratively includes mounting the circuitry 54 (Block 70) on the multilayer circuit board 53, the circuitry being coupled to the membrane switch. The method ends at (Block 71).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
    a multilayer circuit board having a non-planar three-dimensional shape defining a sealed membrane switch recess therein;
    said multilayer circuit board comprising at least one liquid crystal polymer (LCP) layer, and at least one electrically conductive pattern layer defining at least one membrane switch electrode within the sealed membrane switch recess to define a sealed membrane switch;
    circuitry on said multilayer circuit board and coupled to said at least one electrically conductive pattern layer;
    a compressible dielectric material filling the sealed membrane switch recess; and
    at least one spring member within the sealed membrane switch recess.

2. The electronic device according to claim 1 wherein said at least one LCP layer comprises at least one pair thereof; and wherein said multilayer circuit board further comprises a bonding layer between the at least one pair of LCP layers.

3. The electronic device according to claim 2 wherein said bonding layer comprises a curable bonding layer.

4. The electronic device according to claim 2 wherein said bonding layer comprises a thermoplastic bonding layer.

5. The electronic device according to claim 1 wherein said multilayer circuit board defines exterior portions for the sealed membrane switch.

6. The electronic device according to claim 1 wherein said at least one electrically conductive pattern layer comprises at least one of copper, nickel, silver, gold, indium, lead, tin, carbon, and aluminum.

7. An electronic device comprising:
    a multilayer circuit board having a non-planar three-dimensional shape defining a sealed membrane switch recess therein;
    said multilayer circuit board comprising at least one pair of liquid crystal polymer (LCP) layers, a bonding layer between the at least one pair of LCP layers, and at least one electrically conductive pattern layer on each of the LCP layers and defining at least one membrane switch electrode within the sealed membrane switch recess to define a sealed membrane switch;

circuitry carried by said multilayer circuit board and being coupled to said at least one electrically conductive pattern layer, said multilayer circuit board defining exterior portions for the membrane switch;

a compressible dielectric material filling the sealed membrane switch recess; and at least one spring member within the sealed membrane switch recess.

8. The electronic device according to claim 7 wherein said bonding layer comprises a curable bonding layer.

9. The electronic device according to claim 7 wherein said bonding layer comprises a thermoplastic bonding layer.

* * * * *